United States Patent [19]
Wolf et al.

[11] Patent Number: 6,095,397
[45] Date of Patent: Aug. 1, 2000

[54] SOLDER DEPOSIT SUPPORT

[75] Inventors: Jurgen Wolf, Berlin; Gerhard Chmiel, Dulmen, both of Germany

[73] Assignee: Fraunhofer-Gesellschaft zur Forderung der angewandten Forschung e.V., Munich, Germany

[21] Appl. No.: 09/043,014

[22] PCT Filed: Aug. 28, 1996

[86] PCT No.: PCT/DE96/01592

§ 371 Date: Jun. 29, 1998

§ 102(e) Date: Jun. 29, 1998

[87] PCT Pub. No.: WO97/09739

PCT Pub. Date: Mar. 13, 1997

[30] Foreign Application Priority Data

Sep. 8, 1995 [DE] Germany ............... 195 33 169

[51] Int. Cl.[7] .............. B23K 1/00; H01L 21/60; H05K 3/34
[52] U.S. Cl. ............... 228/33; 228/41; 228/118; 228/254
[58] Field of Search ............ 228/254, 56.3, 228/118, 215, 180.22, 33; 428/432, 433, 699, 209, 210; 438/613, 614, 785, 683, 685, 686, 687, 648, 650; 257/737, 738

[56] References Cited

U.S. PATENT DOCUMENTS

| | | | |
|---|---|---|---|
| 4,463,059 | 7/1984 | Bhattacharya et al. | 428/620 |
| 4,832,255 | 5/1989 | Bickford et al. | |
| 4,908,689 | 3/1990 | McBride et al. | 357/67 |
| 5,063,658 | 11/1991 | Wild | |
| 5,072,873 | 12/1991 | Liu et al. | 228/264 |
| 5,171,712 | 12/1992 | Wang et al. | 437/183 |
| 5,217,597 | 6/1993 | Moore et al. | |
| 5,376,584 | 12/1994 | Agarwala | 437/183 |
| 5,391,517 | 2/1995 | Gelatos et al. | 437/190 |
| 5,550,427 | 8/1996 | Hayashi | 313/355 |
| 5,709,957 | 1/1998 | Chiang et al. | 428/615 |
| 5,736,456 | 4/1998 | Akram | 438/614 |
| 5,775,569 | 7/1998 | Berger et al. | 228/254 |
| 5,851,911 | 12/1998 | Farnworth | 438/614 |
| 5,903,058 | 5/1999 | Akram | 257/778 |

FOREIGN PATENT DOCUMENTS 0 273 131 A1 of 0000 European Pat. Off. .
0 352 432 A2 of 0000 European Pat. Off. .

OTHER PUBLICATIONS

IBM Technical Disclosure Bulletin, vol. 36, No. 3, Mar. 1993, New York US, pp. 103–104, XP000354716 "Hydrogen Overvoltage Suppression in Solder Decal Plating".

IBM Technical Disclosure Bulletin, vol. 36, No. 4, Apr. 1993, New York US, pp. 223–224, XP000364495 "Enhanced solder bump retention on solder decals".

Patent Abstracts of Japan vo.18, No. 573 (E–1624), Nov. 2, 1994 and JP, A,06 216135 (Toshiba Corp), Aug. 5, 1994.

*Primary Examiner*—Patrick Ryan
*Assistant Examiner*—Kiley Stoner
*Attorney, Agent, or Firm*—Darby & Darby

[57] ABSTRACT

Solder deposit carrier for the selective soldering of terminal areas of a substrate, comprising on an electrically conductive, non-wettable or wetting-inhibiting coating (12) a transfer mask (13) of an electrically isolating, non-solderable material which exposes the coating in the area of mask openings (14), in which the mask openings (14) serve to accommodate solder deposits (16) electroplated to the coating (12), and the coating (12) comprises two superimposed metal layers (15, 17) of different materials, such that the layer (17) facing towards the mask openings (14) is non-wettable or has a wetting-inhibiting effect, and the layer (15) arranged facing away from the mask openings (14) acts as a current-carrying layer during the electroplating.

12 Claims, 1 Drawing Sheet

SOLDER DEPOSIT SUPPORT

FIELD OF THE INVENTION

The present invention relates to a solder deposit carrier for the selective soldering of terminal areas of a substrate, comprising on an electrically conductive, non-wettable or wetting-inhibiting coating a transfer mask of an electrically isolating, non-solderable material which exposes the coating in the area of mask openings, in which the mask openings serve to accommodate solder deposits electroplated to the coating.

BACKGROUND OF THE PRIOR ART

There is known from U.S. Pat. No. 5,217,597 a method for the selective soldering of terminal areas of a substrate, in which use is made for the transfer of solder deposits onto the terminal areas of the substrate of a solder deposit carrier which comprises for accommodating and transferring the solder deposits a transfer mask with mask openings. For the electroplating of the solder deposits in the mask openings, the latter are disposed on an electrically conductive coating. After deposition of the solder deposits in the mask openings the solder deposits are transferred onto terminal areas of a substrate that are to be soldered, namely by the solder deposit carrier being disposed above the substrate in such a way that the solder deposits are located in an overlap ply with the terminal areas to be soldered. The actual transfer of the solder deposits onto the terminal areas located directly below them takes place by means of a so-called "solder reflow", in which the solder deposits in the mask openings in the transfer mask are heated up beyond the melting temperature of the solder and in so doing wet the terminal area to be soldered. A stripping of the melted solder deposits from the coating at the bottom of the mask openings is made possible in the case of the known solder deposit carrier by the fact that the coating consists of a material which is on the one hand electrically conductive, but on the other, however, also non-solderable, and hence not wettable.

For the coating of the solder deposit carrier there is given in U.S. Pat. No. 5,217,597 a non-wettable material which is known under the title ITO coating and comprises an indium/tin oxide alloy.

During tests with the known solder deposit carrier it was found that the known coating, in which both the function of a galvanic carrier layer and the function of a non-wettable contact layer for the solder deposits in the mask openings is performed by one and the same layer material, leads to disadvantages in the carrying out of the known method. In particular it was found that because of the relatively high electric layer resistance of the known ITO coating an electroplating of solder deposits on the solder deposit carrier is not processable in the case of larger solder deposit carriers, such as are required for example in the processing of structures distributed over a large area, for instance semiconductor wafers, by virtue of the high voltage drops occurring.

Moreover, in the case of the solder deposit carrier known from U.S. Pat. No. 5,217,597 the mask openings in the transfer mask are so proportioned that during the electroplating only one part of the solder deposits can be accommodated within the mask openings, while another part of the solder deposits extends outside the mask openings and their edges in an overlap, with the result that the current-carrying cross-section of the solder deposits changes during the electroplating operation in the outer part of the solder deposits. If said change in the current-carrying cross-section is not compensated by a suitable, sophisticated process control, the result is an irregular solder electroplating and a correspondingly uncontrolled structure composition in the solder deposits, which impedes in particular the formation of eutectic solder bumps or the exact solder composition in general.

OBJECT OF THE INVENTION

The present invention is based on the object of proposing a solder deposit carrier which can also be used for the selective soldering of substrates covering a wider area.

This object is achieved by a solder deposit carrier with the features of claim 1.

SUMMARY OF THE INVENTION

In the solder deposit carrier according to the invention the coating applied to a carrier structure comprises two metal layers of different materials disposed one above the other, such that the contact layer facing towards the mask openings is non-wettable or wetting-inhibiting, and the layer arranged facing away from the mask openings acts as a current-carrying layer during the electroplating.

Due to the separation according to the invention of the coating into two metal layers independent of one another in their functions, the layer materials can each be selected adapted to the respective function in an optimal manner, so that "compromise solutions", as is the case with the known ITO coating, for the production of a material composition which is intended to fulfil both of the above-mentioned functions, are no longer necessary. In order to achieve the current-carrying function, which is essential for the electroplating of the solder material to the coating, a material selection can now be made without regard to the wettability which fulfils optimally the current-carrying function. Accordingly a layer can also be selected for achieving the desired non-wettability which fulfils optimally said requirement and whose electric properties play only a minor role. The layers can be constructed as alloyed and non-alloyed layers.

The division of the coating into two functionally optimized layers independent of one another permits the selection of a material for the layer conducting current during the electroplating which has particularly high electric conductivity and correspondingly small electric resistance, so that with the coating according to the invention, in contrast to the known ITO coating, only relatively low voltage drops can be expected in the coating during the electroplating, and therefore the solder deposit carriers can also be manufactured in sizes such as are required for the selective soldering of whole wafers.

In a preferred embodiment of the solder deposit carrier the current-carrying layer is formed of copper or a copper alloy and the non-wettable or wetting-inhibiting layer of titanium or a titanium alloy. In addition to the particularly good conductivity of a current-carrying layer constructed in this way and the particularly well constructed non-wettability of a contact layer constructed in this way, the coating is characterised in the case of such a material selection by a particularly good thermal stability. Good results have also been achieved if chromium or a chromium alloy, in particular a chromium/tungsten alloy, is used for the contact layer.

It also proves to be particularly advantageous if the transfer mask is provided with mask openings which are proportioned in such a way that the maximum cross-sectional area of the solder deposits in the plating direction is determined by the opening cross-section of the mask openings. In this way it is ensured that the current-carrying cross-sectional area of the solder deposits, when the latter are plated continuously in the mask openings, is constant during the whole of the electroplating. Thus the current density remains unchanged during the plating operation, even without sophisticated process control, so that the result is a regular solder electroplating with a corresponding structure of the solder deposits. Since solder deposits plated in such mask openings do not have a projection extending laterally over the edges of the mask openings, smaller distances between the solder deposits and hence higher resolutions in the solder deposit array are also possible.

In a further embodiment of the solder deposit carrier the carrier structure is constructed so as to be deformable, in order to permit a better adjustment of the solder deposit carrier topography by a close join to the substrate to be wetted. In this way the wetting of the terminal area metallizations of the substrate that are to be soldered, and hence the transfer of the solder deposits onto the terminal areas of the substrate, is facilitated. A flexible construction of the carrier structure proves to be particularly advantageous in this connection, since because of the elastic restoring forces of the carrier structure the same initial form of the solder deposit carrier or of the carrier structure is available again for each subsequent, renewed use of the solder deposit carrier. In this way reproducibility in the execution of the transfer process also becomes possible in the case of deformable carrier structures.

A particularly advantageous way of manufacturing the solder deposit carrier is provided if the carrier structure is constructed as a laminate of several laminate plies or else as a single laminate ply. If in addition to this at least the current-carrying layer, i.e. the layer adjoining the carrier structure, is constructed as a laminate ply, it is possible to manufacture at least one part of the coating as a laminate together with the carrier structure. In addition to this, the non-wettable or wetting-inhibiting layer disposed on the current-carrying layer can also be constructed as a laminate ply and be connected to the current-carrying layer in the laminating process.

In order to enhance the adhesion of the solder deposits applied to the non-wettable or wetting-inhibiting layer, and hence the handling of the solder deposit carrier during the solder deposit transfer, the surface of the coating can exhibit a roughness height which is more than 1 μm. In this way care is taken to provide a reliable adhesion of the solder deposits to the coating without the dewetting which occurs during the solder deposit reflow for transferring the solder deposits onto the terminal areas of the substrate being adversely affected. Particularly good results were obtained with a roughness height in the range of 3 to 5 μm.

In order to produce the roughness height in the surface of the non-wettable or wetting-inhibiting layer, it proves to be particularly advantageous if the surface of the current-carrying layer is provided with the roughness height desired for the surface of the non-wettable or wetting-inhibiting layer disposed above it, wherein said roughness height is then, as a result of the non-wettable or wetting-inhibiting layer applied in uniform thickness, imaged in the surface of the latter.

BRIEF DESCRIPTION OF THE DRAWINGS

An embodiment of the solder deposit carrier will be explained in detail below with reference to the drawings, where.

DETAILED DESCRIPTION OF THE INVENTION

Figure 1:
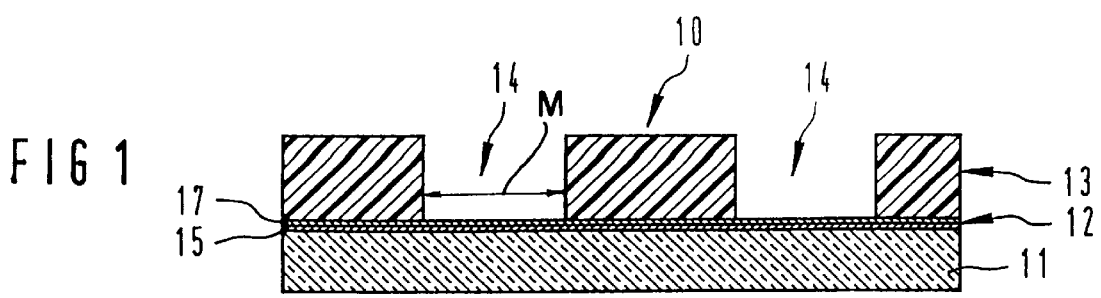
FIG. 1 shows a solder deposit carrier before the electroplating of solder deposits, FIG. 2 the solder deposit carrier after the electroplating of the solder deposits, FIG. 3 the solder deposit carrier in an overlap ply with a substrate to be soldered, FIG. 4 the solder deposit carrier during the transfer of the solder deposits to terminal areas of the substrate and FIG. 5 the substrate with solder bumps applied to the terminal areas.

FIG. 1 shows a solder deposit carrier 10 with a carrier structure 11 here formed from a silicon wafer or from a wafer part unit, on the surface of which a coating 12 is disposed. There can be used for the carrier structure semiconductor materials in general and also other materials, such as for example printed circuit board materials or ceramic materials. On the coating 12 is located a transfer mask 13 with mask openings 14 provided therein. The transfer mask 13 consists in this embodiment of a photolithographically structured polymer mask, for example of polyamide, BCB or else epoxy resin. In addition to the aforementioned examples of a permanent mask, which makes frequent reuse of the solder deposit carrier a possibility, other materials and methods can also be used for the manufacture of the transfer mask. Thus photolithographic or laser optically structured resist masks can also be used as examples of a temporary mask.

Figure 2:
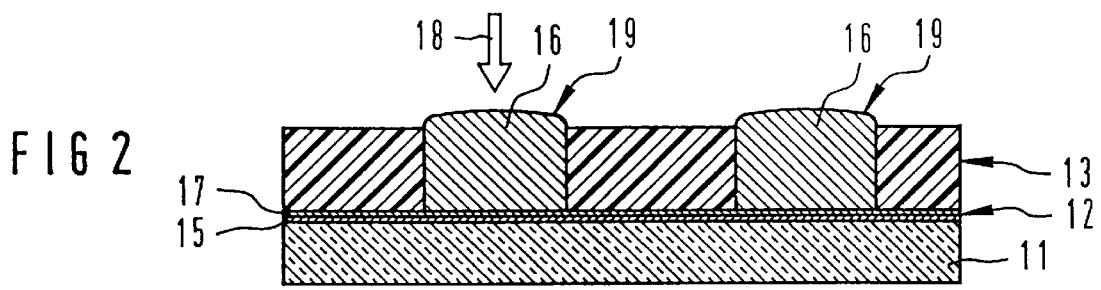

The coating 12 comprises two superimposed layers, namely a current-carrying layer 15 conducting current during an electroplating operation and a contact layer 17 disposed thereon and making contact with electroplated solder deposits 16 (FIG. 2). By way of departure from the embodiment shown in FIG. 1, in which the layers 15 and 17 are constructed so as to cover one another over their whole surfaces, the current-carrying layer 15 can also consist of coherent part layers disposed in a plane and the contact layer 17 of part layers constructed thereon in the area of the mask openings. In the embodiment shown here the current-carrying layer 15 consists of an approximately 1 μm thick copper layer and the contact layer 17 of an approximately 200 nm thick layer of a titanium/tungsten alloy. In order to prevent a deformation of the carrier structure 11 as a result of the application of the coating 12, it has proved to be particularly advantageous in tests to apply the coating to both sides of the carrier structure 11. In addition, a composition of the coating 12 consisting of three layers in all, not all of which are shown here, has proved to be advantageous, wherein in addition to the current-carrying layer 15 and the contact layer 17 a further priming layer, for example of a titanium/tungsten alloy with a thickness of some 200 nm, can also be provided between the surface of the carrier structure 11 and the current-carrying layer 15. The priming layer serves both as an adhesion layer and as a diffusion barrier layer. The layer thicknesses given by way of example can be varied at will, provided the aforementioned functions of the various layers are still ensured.

FIG. 2 shows the solder deposit carrier 10 after the carrying out of electroplating of the solder deposits 16 to the coating 12 in the area of the mask openings 14. The solder material of the solder deposits 16 consists here of a lead/tin alloy (63% Sn/37% Pb) and is substantially absorbed completely by the mask openings 14. All solder materials from which solder deposits are manufacturable by the electroplating method can be used in principle. FIG. 2 shows clearly that the maximum cross-sectional area $F_{max}$ of the solder deposits 16 coincides with the cross-sectional area M of the mask openings 14 and is constant in the plating direction (arrow 18). A projection 19 of the solder deposits 16 beyond the transfer mask 13 is formed merely by a meniscus produced during the electroplating. Because of the very largely constant cross-sectional area of the solder deposits 16, a very largely constant, homogeneous structure composition is obtained during the deposition of the solder deposits.

Figure 3:
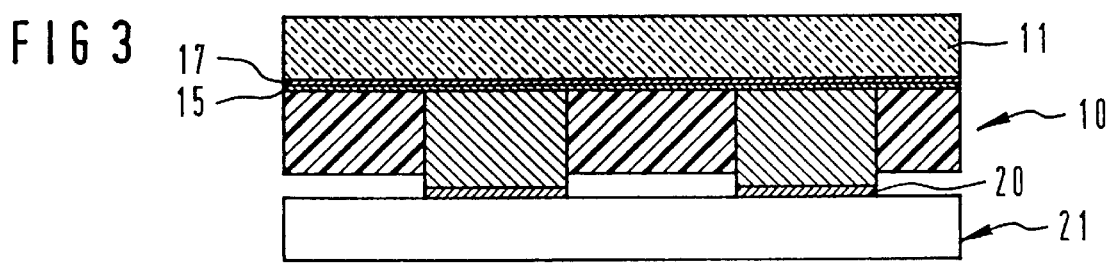

FIG. 3 shows the solder deposit carrier 10 in an downwardly directed position with the solder deposits 16 accommodated solidified in the mask openings 14, wherein the solder deposits 16 are in preparation for their transfer to terminal metallizations 20 of a substrate 21 situated in an overlap ply with the terminal metallizations 20.

The substrate 21 can be a chip with any distribution of terminal metallizations 20 or else a substrate acting as a chip carrier, in particular with a surface-distributed array of terminal metallizations 20, such as is known under the term "Ball Grid Array" (BGA).

The terminal metallizations 20 which consist in the present case of a nickel/gold alloy, are formed for example dead on standard terminal areas consisting of an aluminium/silicon alloy (99% Al/1% Si).

Figure 4:
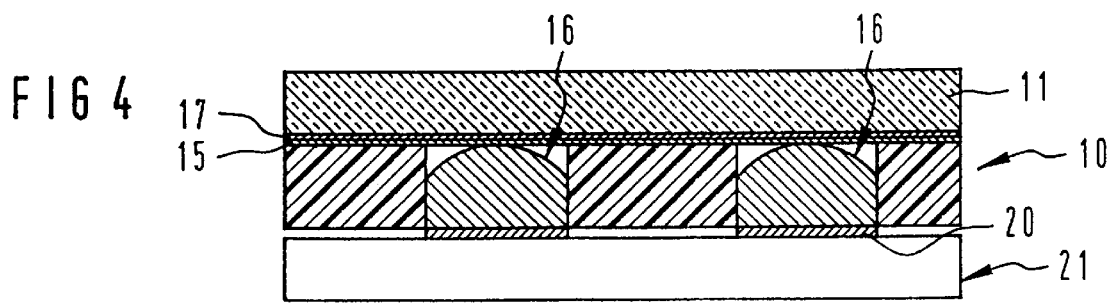

FIG. 4 shows how a transfer of the solder deposits onto the terminal metallizations 20 of the substrate 21 takes place by means of a so-called "solder deposit reflow", in which the solder material deposited in the form of the solder deposits 16 is remelted again. In order that this transfer takes place as completely as possible, the wetting-inhibiting or non-wettable construction of the contact layer 17, which construction counteracts a wetting or an adherence of the solder deposits 16 to the contact layer 17, is particularly critical.

Figure 5:
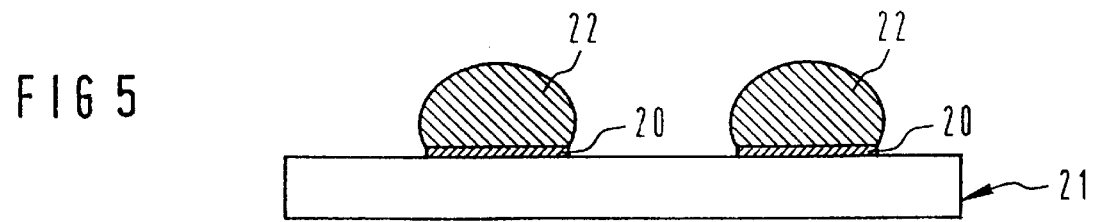

FIG. 5 shows finally the solder bumps 22 formed after the lifting off of the solder deposit carrier 10 from the substrate 21 on the terminal metallizations 20 of the substrate.

In order to prevent an oxidation of the solder material occurring during the melting of the solder deposits 16 and the associated dewetting or separation of the solder deposits 16 from the contact layer 17, the melting and also the transfer of the solder deposits can take place in a reducing or inert atmosphere. In addition, a flux can be used to promote the transfer of the solder deposit onto the substrate.

In order to improve the adhesion of the solder deposits to the contact layer 17 the surface of the current-carrying layer 15 can be roughened and exhibit a roughness height in the range of 3 to 5 μm. The roughening of the current-carrying layer 15, which as a rule has a far greater thickness than the contact layer 17, can take place by means of known mechanical methods, e.g. by lapping or grinding.

In a tested embodiment of the solder deposit carrier there was used as carrier material the printed circuit board material FR 4/5 with a laminated-on, approx. 20 μm thick copper foil as the current-carrying layer. The surface of the current-carrying layer was roughened by means of lapping in order to obtain a roughness height of 3 to 5 μm. The non-wettable or wetting-inhibiting layer was applied as a titanium/tungsten layer by means of sputtering, whereby the topography of the current-carrying, roughened layer was imaged in the contact layer. The contact layer thus exhibited the desired roughness height of between 3 and 5 μm. When the solder deposit carrier constructed in this way was used to transfer solder deposits, it was found that the adhesion of the electroplated solder deposits to the contact layer was improved, without the dewetting of the solder deposits being adversely affected during the subsequent solder deposit reflow to transfer the solder deposits.

It was also found during the aforementioned tests that, independently of the composition and nature of any material layers lying below it, a surface of the contact layer which is provided with a deliberately increased roughness height improves fundamentally the adhesion between the contact layer and wetting solder deposits arranged on it, without adversely affecting a subsequent dewetting. Said advantageous effect of the contact layer provided with roughened surface is independent of the manner in which the solder deposits are applied to the contact layer. The effect also occurs for example with physical deposition methods, such as evaporation, solder deposit deposition, solid-state solder deposition.

What is claimed is:

1. A solder deposit carrier for depositing solder deposits by electroplating in an array defined by mask openings and for transferring said solder deposits on terminal areas of a substrate, comprising on an electrically conductive, non-wettable or wetting-inhibiting coating a transfer mask of an electrically isolating, non-solderable material which exposes the coating in the area of mask openings, in which the mask openings serve to accommodate solder deposits electroplated onto the coating, wherein the coating (12) applied to a carrier structure (11) comprises two superimposed metal layers (15, 17) of different materials, such that the layer (17) facing towards the mask openings (14) is non-wettable or has a wetting-inhibiting effect, and the layer (15) arranged facing away from the mask openings (14) acts as a current-carrying layer during the electroplating.

2. The solder deposit carrier according to claim 1, wherein the current-carrying layer (15) is made from one of copper and copper alloy and the wetting-inhibiting layer (17) is made from one of titanium and a titanium alloy.

3. The solder deposit carrier according to claim 1, wherein the transfer mask (13) includes a plurality of mask openings (14), which are so proportioned that the maximum cross-sectional area $F_{max}$ of the solder deposits (16) in the plating direction (18) is determined by the opening cross-section M of the mask openings (14).

4. The solder deposit carrier according to claim 1, wherein the carrier structure (11) is constructed so as to be deformable.

5. The solder deposit carrier according to claim 1, wherein the carrier structure (11) is constructed so as to be flexible.

6. The solder deposit carrier according to claim 1, wherein the carrier structure (11) comprises a laminate including several laminate plies.

7. The solder deposit carrier according to claim 1, wherein the carrier structure (11) comprises a single laminate ply.

8. The solder deposit carrier according to claim 2, wherein the wetting-inhibiting layer (17) is a non-wettable layer.

9. The solder deposit carrier according to claim 6, wherein at least the current-carrying layer (15) of the coating (12) is a laminate ply and is connected to the carrier structure (11).

10. The solder deposit carrier according to claim 6, wherein the coating includes a surface and wherein the surface has a roughness of more than a micrometer.

11. The solder deposit carrier according to claim 10, wherein the current-carrying layer (15) includes a surface and wherein the current-carrying surface has a roughness of more than a micrometer, and the non-wettable is applied uniformly to the layer (15).

12. The solder deposit carrier according to claim 10, wherein the current-carrying layer (15) includes a surface and wherein the current-carrying surface has a roughness of more than a micrometer, and the wetting-inhibiting layer is applied uniformly to the layer (15).

* * * * *